United States Patent
Harada et al.

(10) Patent No.: US 7,053,810 B2
(45) Date of Patent: May 30, 2006

(54) SUCCESSIVE APPROXIMATION ANALOG/DIGITAL CONVERTER WITH REDUCED CHIP AREA

(75) Inventors: Hisashi Harada, Hyogo (JP); Takahiro Miki, Hyogo (JP); Hideo Matsui, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/151,551

(22) Filed: Jun. 14, 2005

(65) Prior Publication Data

US 2005/0231404 A1  Oct. 20, 2005

Related U.S. Application Data

(63) Continuation of application No. 10/895,090, filed on Jul. 21, 2004, now Pat. No. 6,919,837.

(30) Foreign Application Priority Data

Jul. 28, 2003 (JP) .............................. 2003-280922

(51) Int. Cl.
*H03M 1/34* (2006.01)
(52) U.S. Cl. .................. 341/163; 341/161; 341/155
(58) Field of Classification Search ................ 341/172, 341/120, 156, 118, 155, 144, 154, 163, 161
See application file for complete search history.

(56) References Cited

U.S. PATENT DOCUMENTS

| 4,415,882 | A | 11/1983 | Akazawa et al. |
| 4,654,815 | A | 3/1987 | Marin et al. |
| 5,764,175 | A * | 6/1998 | Pan .............................. 341/161 |
| 6,124,818 | A | 9/2000 | Thomas et al. |
| 6,424,284 | B1 * | 7/2002 | Lopata et al. ................ 341/163 |
| 6,664,911 | B1 * | 12/2003 | Hirai ........................... 341/159 |

FOREIGN PATENT DOCUMENTS

JP  08-149007  6/1996

* cited by examiner

*Primary Examiner*—Brian Young
(74) *Attorney, Agent, or Firm*—McDermott Will & Emery LLP

(57) ABSTRACT

A successive approximation A/D converter includes first and second S/H and comparators sampling and holding first and second external analog input voltages simultaneously and comparing the held, first and second external analog input voltages with a reference voltage to output first and second signals having levels corresponding to resultant comparisons, and a reference voltage generator operative in response to the first and second signals to generate the reference voltage. The two S/H and comparators share the single reference voltage generator. A reduced chip area can be achieved.

4 Claims, 9 Drawing Sheets

SUCCESSIVE APPROXIMATION ANALOG/DIGITAL CONVERTER WITH REDUCED CHIP AREA

RELATED APPLICATION

This application is a continuation of U.S. application Ser. No. 10/895,090 filed on Jul. 21, 2004 is now a U.S. Pat. No. 6,919,837.

BACKGROUND OF THE INVENTION

1. Field of the Invention

The present invention relates generally to successive approximation Analog/Digital (A/D) converters and particularly to those converting a plurality of analog input voltages each to a digital signal.

2. Description of the Background Art

Conventionally, A/D converters for servo control and other similar, mechanical control have been implemented by successive approximation A/D converters. The successive approximation A/D converter samples and holds an analog input voltage and then compares the held analog input voltage with a plurality of reference voltages sequentially to convert analog input voltage to a multibit digital signal, for example as described in Japanese Patent Laying-Open No. 08-149007.

Conventionally, simultaneously sampling a plurality of analog input voltages necessitates a plurality of successive approximation A/D converters, which disadvantageously contributes to an increased chip area for the converters.

SUMMARY OF THE INVENTION

The present invention mainly contemplates a successive approximation A/D converter capable of sampling a plurality of analog input voltages simultaneously, and requiring a reduced chip area.

The present invention provides a successive approximation A/D converter including: a plurality of comparators associated with a plurality of analog input voltages, respectively, to each sample and hold a corresponding one of the analog input voltages to compare a held analog input voltage with a voltage of a comparison node to output a signal indicative of a resultant comparison; a control circuit causing the plurality of comparators to simultaneously sample and hold the plurality of analog input voltages and subsequently select the plurality of comparators sequentially, one for a prescribed period of time, to generate the digital signal as based on a signal output from a selected one of the comparators; and a reference voltage generator operative in response to the signal output from the comparator selected by the control circuit to control in voltage a comparison node of the comparator selected. Thus a plurality of analog input voltages can simultaneously be sampled and held. Furthermore, the plurality of comparators sharing a single reference voltage generator can contribute to a reduced chip area.

Furthermore, the present invention in another aspect provides a successive approximation A/D converter including: a plurality of comparators associated with a plurality of analog input voltages, respectively, to each sample and hold a corresponding one of the analog input voltages to compare a held analog input voltage with a voltage of a comparison node to output a signal indicative of a resultant comparison; a control circuit causing the plurality of comparators to sample and hold the plurality of analog input voltages simultaneously and subsequently in response to a signal output from each comparator generate the digital signal; a voltage generation circuit generating a plurality of different reference voltages; and a selector associated with each comparator and operative in response to a signal output from a corresponding one of the comparators to select one of the plurality of reference voltages and provide a selected one of the reference voltages to a comparison node of the corresponding one of the comparators. Furthermore, the plurality of comparators sharing a single voltage generation circuit can contribute to a reduced chip area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
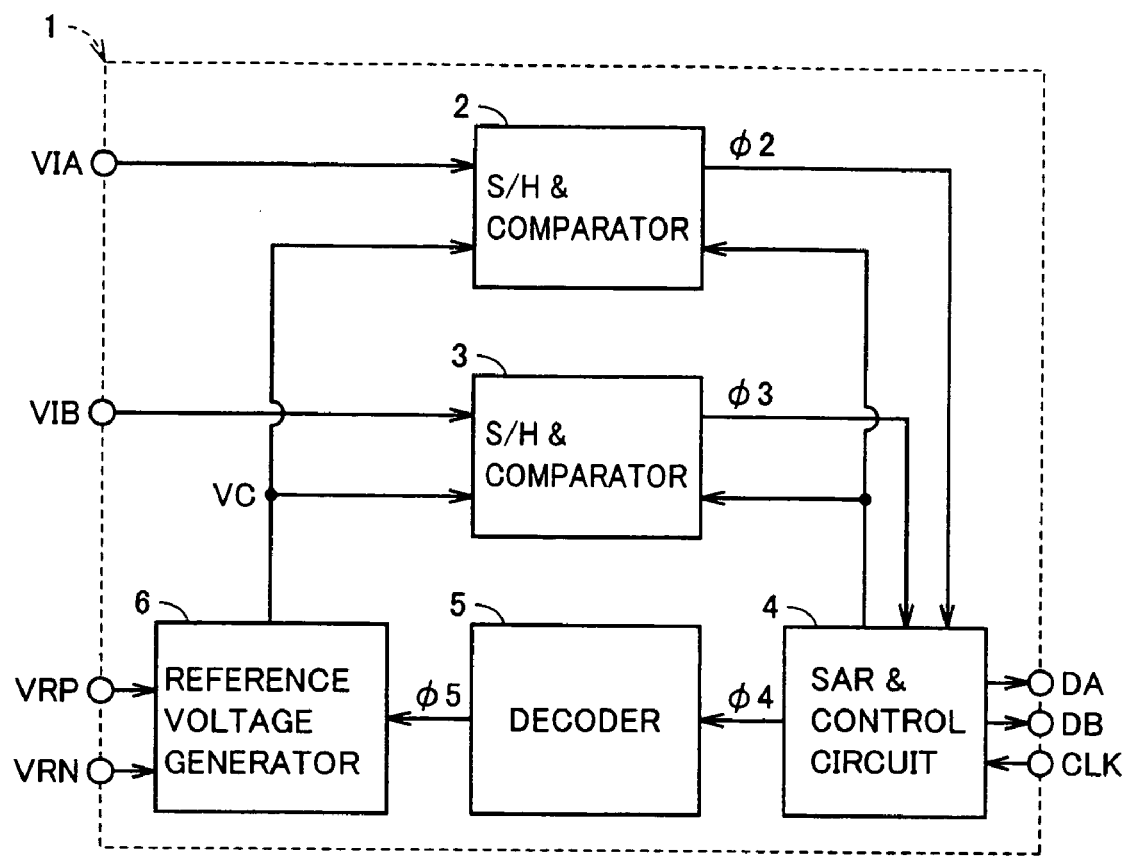
FIG. 1 is a block diagram showing a configuration of the present successive approximation A/D converter in a first embodiment.

FIG. 1 is a block diagram showing a configuration of a successive approximation A/D converter 1 of the present invention in a first embodiment. As shown in FIG. 1, successive approximation A/D converter 1 includes sample and hold (S/H) and comparators 2 and 3, a successive approximation register (SAR) and control circuit 4, a decoder 5, and a reference voltage generator 6.

S/H and comparator 2 is controlled by SAR and control circuit 4 to sample and hold an external analog input voltage VIA and compare in level the held analog input voltage VIA with a reference voltage VC received from reference voltage generator 6 and outputs to SAR and control circuit 4 a signal φ2 having a level corresponding to a result of the comparison.

S/H and comparator 3 is controlled by SAR and control circuit 4 to sample and hold an external analog input voltage VIB and compare in level the held analog input voltage VIB with reference voltage VC received from reference voltage generator 6 and outputs to SAR and control circuit 4 a signal φ3 having a level corresponding to a result of the comparison.

SAR and control circuit 4 is synchronized with an external clock signal CLK to operate to control S/H and comparators 2 and 3. Furthermore, SAR and control circuit 4 is driven by signals φ2 and φ3 received from S/H and comparators 2 and 3 to generate and output an internal data signal φ4 to decoder 5 and also generate and externally output digital codes DA and DB corresponding to analog input voltages VIA and VIB. Digital codes DA and DB each include a multibit (herein, 3-bit to simplify the description) data signal. Decoder 5 receives internal data signal φ4 from SAR and control circuit 4 and decodes signal φ4 to generate and output a control signal φ5 to reference voltage generator 6.

Figure 2:
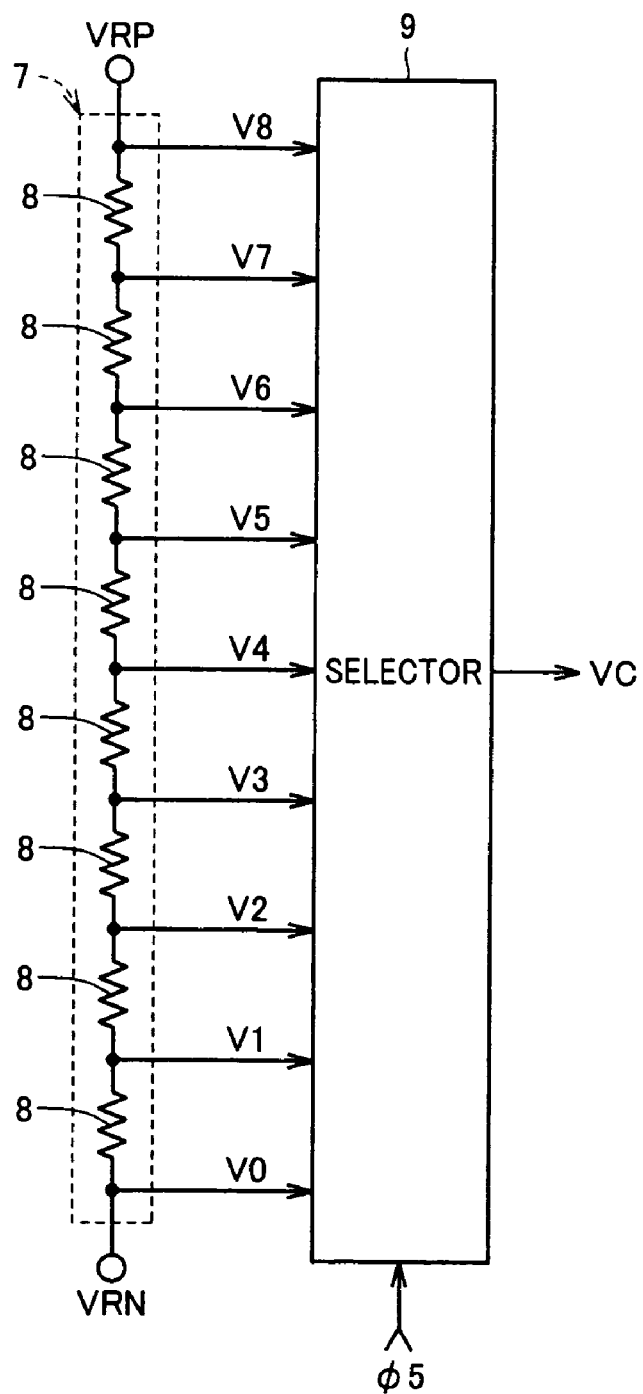
FIG. 2 is a circuit block diagram showing a configuration of the reference voltage generator shown in FIG. 1.

With reference to FIG. 2, reference voltage generator 6 includes a resistor ladder 7 and a selector 9. Resistor ladder 7 includes a plurality of series connected resistor elements 8 to divide externally applied reference voltages for high and low reference voltages VRP and VRN, respectively, to generate nine levels of reference voltage V0–V8. Selector 9 receives control signal φ5 from decoder 5 and in accordance therewith selects one of the nine levels of reference voltage V0–V8 to provide the selected voltage as reference voltage VC to each of S/H and comparators 2 and 3.

Figure 3A:
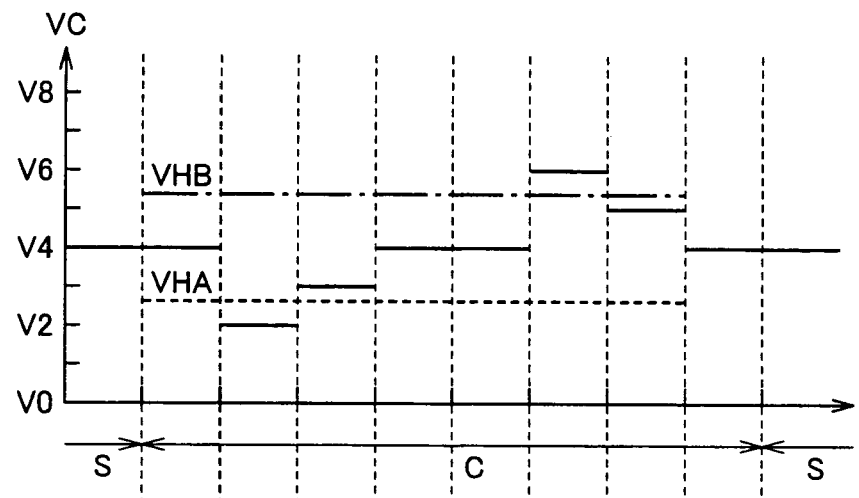
FIGS. 3A and 3B are timing plots for illustrating the FIG. 1 successive approximation A/D converter in operation.
Figure 3B:
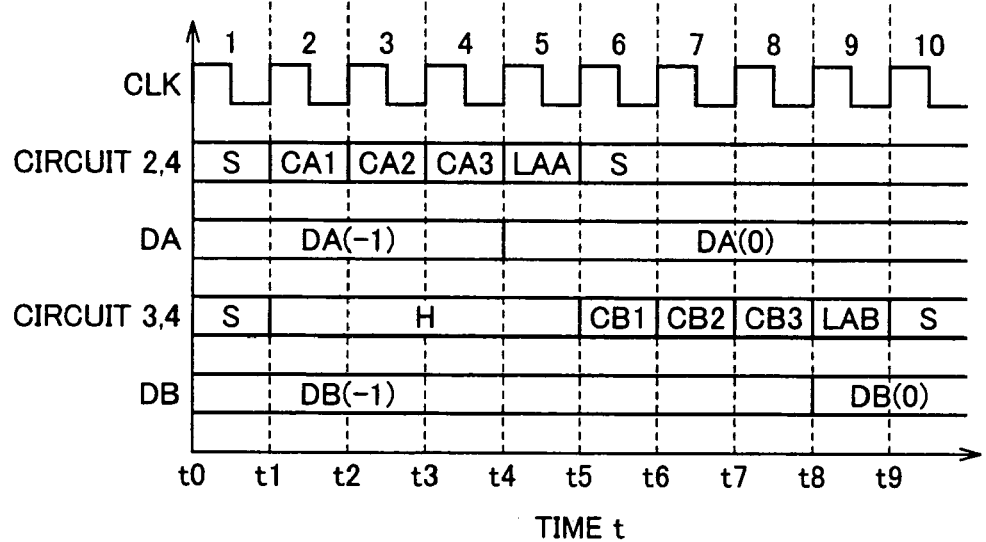

FIGS. 3A and 3B are timing plots for illustrating successive approximation A/D converter 1 in operation. As shown in the figures, successive approximation A/D converter 1 operates in response to a rising edge of clock signal CLK on the basis of a period of one cycle (one period) of clock signal CLK.

To perform A/D conversion once, sampling S for a period of one cycle and comparison C for a period of eight cycles are performed, and comparison C includes S/H and comparator 2 performing comparison three times, i.e., comparisons CA1–CA3, and SAR and control circuit 4 performing a latch LAA once, and S/H and comparator 3 performing comparison three times, i.e., comparisons CB1–CB3, and SAR and control circuit 4 performing a latch LAB once.

Initially in a cycle 1 (time t0 to time t1) S/H and comparators 2 and 3 sample (S) external analog input voltages VIA and VIB. The sampled external analog input voltages VIA and VIB are held by S/H and comparators 2 and 3, respectively, in response to clock signal CLK rising at time t1. The voltages held by S/H and comparators 2 and 3 will be referred to as VHA and VHB, respectively.

In a cycle 2 (time t1 to time t2) reference voltage generator 6 sets reference voltage VC at reference voltage V4 intermediate between V0 and V8 and S/H and comparator 2 compares VHA with V4 (CA1). Herein, VHA is a voltage between V2 and V3 for the sake of illustration. VHA<V4, and signal φ2 is set low (0).

In a cycle 3 (time t2 to time t3), in response to signal φ2 SAR and control circuit 4, decoder 5 and reference voltage generator 6 sets reference voltage VC at voltage V2 between intermediate voltage V4 and lowest voltage V0 and S/H and comparator 2 compares VHA with V2 (CA2). VHA>V2, and signal φ2 set high (1).

In a cycle 4 (time t3 to time t4), in response to signal φ2 SAR and control circuit 4, decoder 5 and reference voltage generator 6 sets 0 reference voltage VC at voltage V3 between V2 and intermediate voltage V4 and S/H and comparator 2 compares VHA with V3 (CA3). VHA<V3, and signal φ2 set low (0).

In a cycle 5 (time t4 to time t5) signals φ2 for four cycles 2–4 are latched by SAR and control circuit 4 (LAA) and output as data code DA(0)=010. Signal φ2 for cycle 2 serves as data code DA's MSB and signal φ2 for cycle 4 serves as data code DA's LSB. In cycle 5, reference voltage generator 6 resets reference voltage VC to voltage V4 intermediate between V0 and V8. Note that data code DA(0) is preceded by data code DA(−1), which indicates a result of previous A/D conversion.

In a cycle 6 (time t5 to time t6) reference voltage generator 6 sets reference voltage VC at voltage V4 intermediate between V0 and V8 and S/H and comparator 3 compares VHB with V4 (CB1). Herein, VHB is a voltage between V5 and V6 for the sake of illustration. VHB>V4, and signal φ3 is set high (1).

In a cycle 7 (time t6 to time t7), in response to signal φ3 SAR and control circuit 4, decoder 5 and reference voltage generator 6 sets reference voltage VC at voltage V6 between intermediate voltage V4 and highest voltage V8 and S/H and comparator 3 compares VHB with V6 (CB2). VHB<V6, and signal φ3 set low (0).

In a cycle 8 (time t7 to time t8), in response to signal φ3 SAR and control circuit 4, decoder 5 and reference voltage generator 6 sets reference voltage VC at voltage V5 between V6 and V4 and S/H and comparator 3 compares VHB with V5 (CB3). VHA>V5, and signal φ3 set high (1).

In a cycle 9 (time t8 to time t9) signals φ3 for four cycles 6–8 are latched by SAR and control circuit 4 (LAB) and output as data code DB(0)=101. Signal φ3 for cycle 6 serves as data code DB's MSB and signal φ3 for cycle 8 serves as data code DB's LSB. In cycle 9, reference voltage generator 6 resets reference voltage VC to voltage V4 intermediate between V0 and V8. Note that data code DB(0) is preceded by data code DB(−1), which indicates a result of previous A/D conversion.

In the first embodiment two S/H and comparators 2 and 3 allow two analog input voltages VIA and VIB to simultaneously be sampled. Furthermore, two S/H and comparators 2 and 3 sharing SAR and control circuit 4, decoder 5 and reference voltage generator 6 can contribute to a reduced chip area.

Note that while the first embodiment has been described in conjunction with a single-input and single-output, successive approximation A/D converter 1, the present invention is also applicable to differential input and differential output, successive approximation A/D converters.

Furthermore, while in the first embodiment two S/H and comparators 2 and 3 share SAR and control circuit 4, decoder 5 and reference voltage generators 6, more than two S/H and comparators may share SAR and control circuit 4, decoder 5 and reference voltage generator 6. A further effectively reduced chip area can be achieved.

Figure 4A:
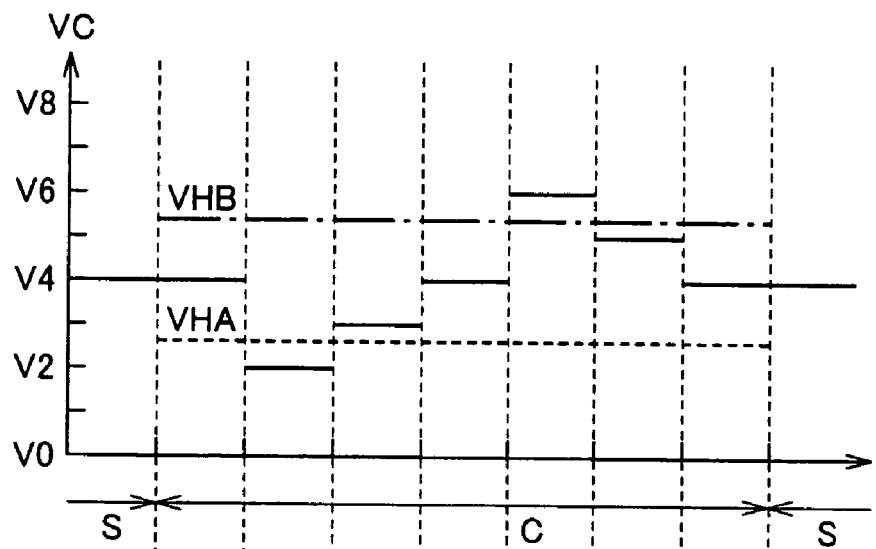
FIGS. 4A and 4B are timing plots for illustrating the first embodiment in an exemplary variation.
Figure 4B:
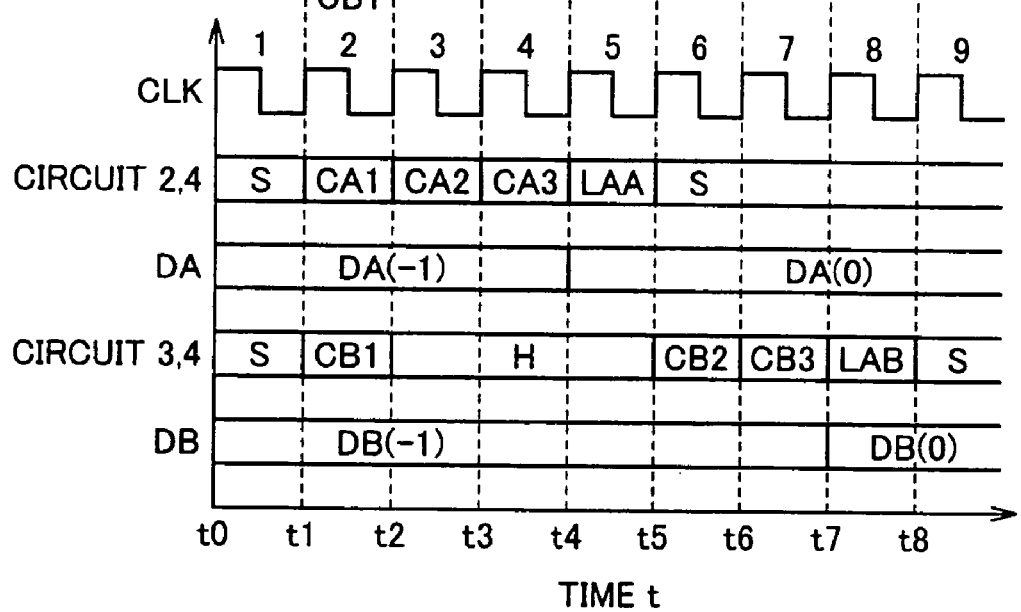

Furthermore, as S/H and comparators 2 and 3 perform first comparisons CA1 and CB2 using a single reference voltage VC=V4, S/H and comparators 2 and 3 may perform the first comparisons CA1 and CB1 in the same cycle 2, as shown in FIGS. 4A and 4B. In that case, the time required to perform A/D conversion once can be reduced by one cycle.

Second Embodiment

Figure 5:
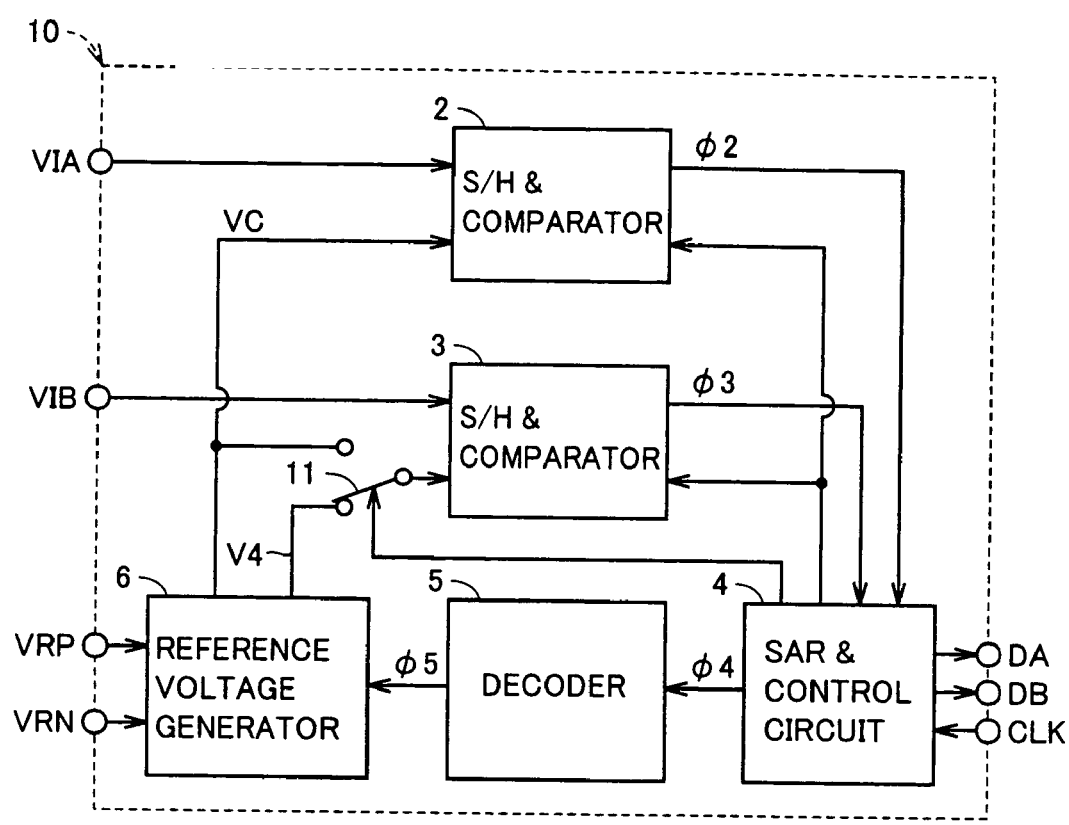
FIG. 5 is a circuit block diagram showing a configuration of the present successive approximation A/D converter in a second embodiment.

FIG. 5 is a block diagram showing a configuration of a successive approximation A/D converter 10 of the present invention in a second embodiment. With reference to FIG. 5, successive approximation A/D converter 10 differs from the FIG. 1 successive approximation A/D converter 1 in that the former further includes a switch 11. Switch 11 is controlled by SAR and control circuit 4. While S/H and comparator 3 performs comparisons CB1–CB3, switch 11 passes S/H and comparator 3 reference voltage VC generated by reference voltage generator 6. While S/H and comparator 3 does not perform comparisons CB1–CB3, switch 11 passes S/H and comparator 3 voltage V4 used by S/H and comparator 3 for the first comparison CB1.

In the FIG. 1 successive approximation A/D converter 1 S/H and comparator 3 also compares VIB and VC in cycles 2–5 of FIGS. 3A and 3B and signal φ3 varies in level. If signal φ3 varies in level in cycles 5 and 6, a recovery time is required for signal φ3 to vary in level. This recovery time is, however, an obstacle to speeding up the successive approximation A/D converter and increasing its precision.

For successive approximation A/D converter 10, in cycles 2–5 V4 is applied to S/H and comparator 3. Accordingly in cycles 5 and 6 signal φ3 does not vary in level and recovery time is not introduced. Successive approximation A/D converter 10 can be operated faster and increased in precision.

If S/H and comparator 3 does not perform comparisons CB1–CB3 reference voltage generator 6 and S/H and comparator 3 may electrically be disconnected, although in that case S/H and comparator 3 has a comparison voltage input node attaining high impedance state, and noise or the like destabilizes signal φ3 in level and recovery time is introduced.

Furthermore while the FIG. 5 successive approximation A/D converter 10 employs intermediate voltage V4 generated in reference voltage generator 6 at resistor ladder 7, intermediate voltage V4 may be generated by a separately provided voltage divider circuit.

Third Embodiment

Figure 6:
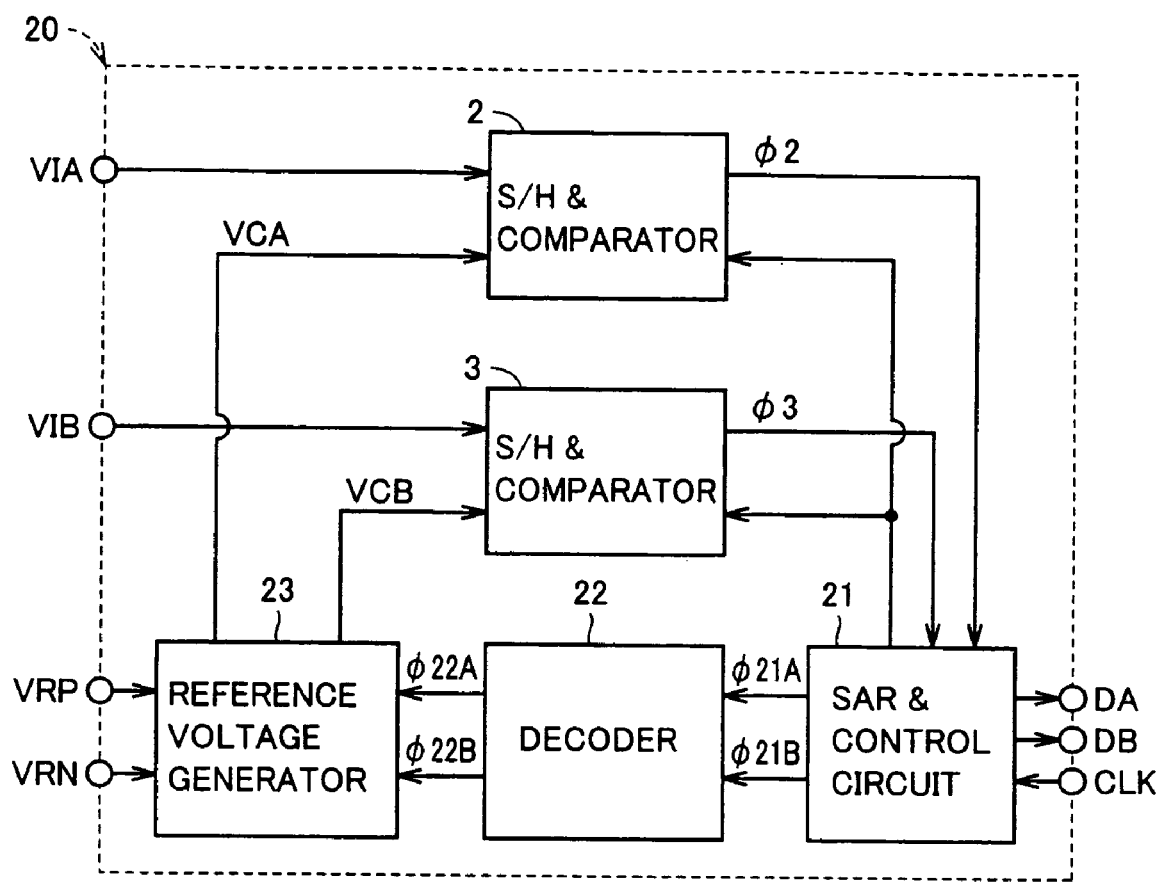
FIG. 6 is a block diagram showing a configuration of the present successive approximation A/D converter in a third embodiment.

FIG. 6 is a circuit block diagram showing a configuration of a successive approximation A/D converter 20 of the present invention in a third embodiment. With reference to FIG. 6, successive approximation A/D converter 20 includes S/H and comparators 2 and 3, an SAR and control circuit 21, a decoder 21 and a reference voltage generator 23. S/H and comparators 2 and 3 operate as has been described with reference to FIG. 1.

SAR and control circuit 21 is synchronized with external clock signal CLK to operate to control S/H and comparators 2 and 3. Furthermore, SAR and control circuit 21 is driven by signals φ2 and φ3 received from S/H and comparators 2 and 3 and indicating resultant comparisons to generate and output internal data signals φ21A and φ21B to decoder 22 and also generate and externally output digital codes DA and DB corresponding to analog input voltages VIA and VIB.

Decoder 22 receives internal data signals φ21A and φ21B from SAR and control circuit 21 and decodes them to generate and output a control signals φ22A and φ22B to reference voltage generator 23.

Figure 7:
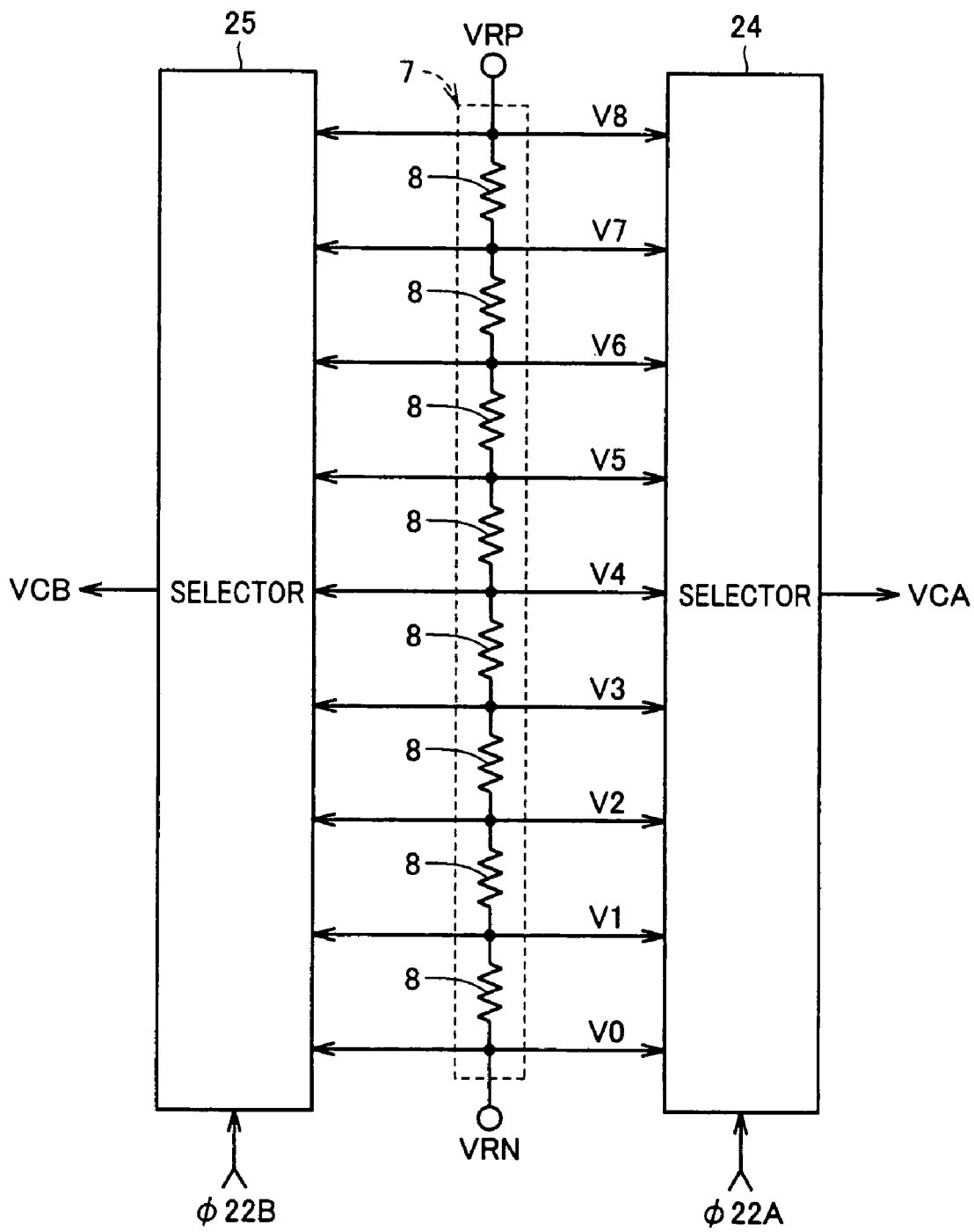
FIG. 7 is a circuit block diagram showing a configuration of the reference voltage generator shown in FIG. 6.

With reference to FIG. 7, reference voltage generator 23 includes resistor ladder 7 and selectors 24 and 25. Resistor ladder 7 is identical to that shown in FIG. 2, dividing a voltage between reference voltages VRP and VRN to generate nine levels of reference voltage V0–V8. Selector 24 operates in response to control signal φ22A received from decoder 22 to select one of the nine levels of reference voltage V0–V8 and provide the selected voltage as a reference voltage VCA to S/H and comparator 2. Selector 25 operates in response to control signal φ22B received from decoder 22 to select one of the nine levels of reference voltage V0–V8 and provide the selected voltage as a reference voltage VCB to S/H and comparator 3.

Figure 8A:
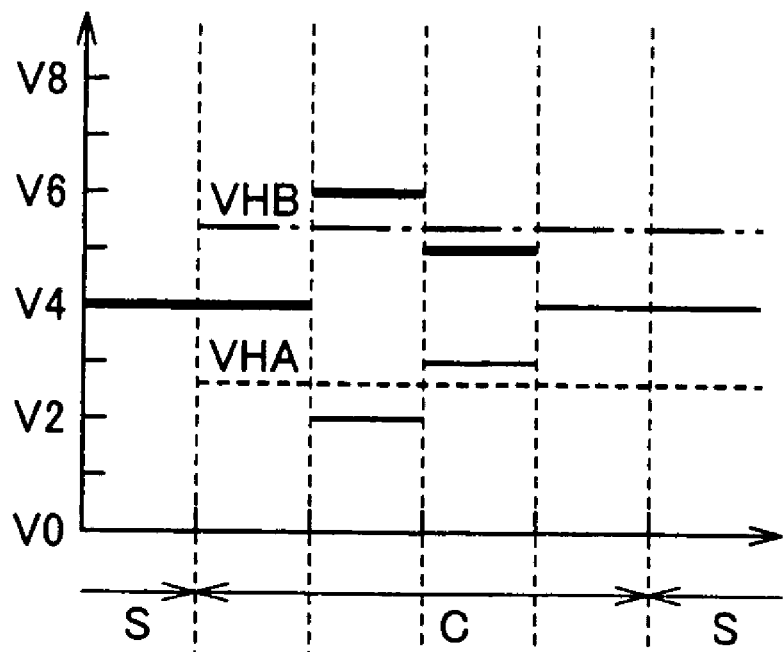
FIGS. 8A and 8B are timing plots for illustrating the FIG. 6 successive approximation A/D converter in operation.
Figure 8B:
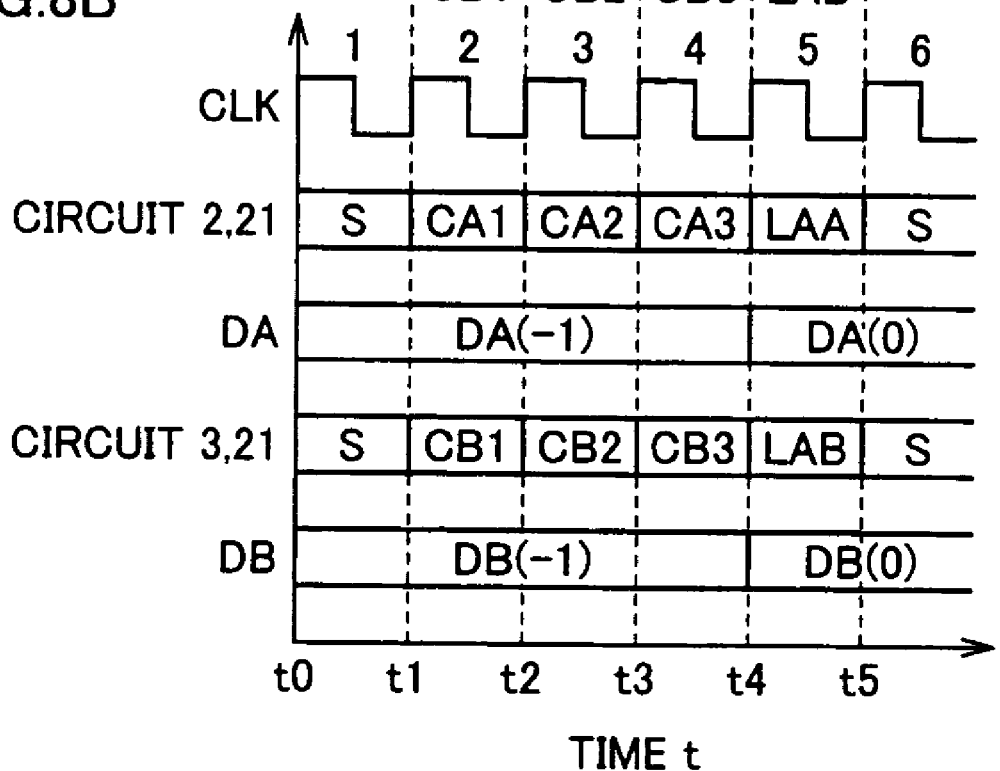

FIGS. 8A and 8B are timing plots for illustrating successive approximation A/D converter 20 in operation. As shown in the figures, successive approximation A/D converter 20 operates in response to a rising edge of clock signal CLK on the basis of a period of one cycle of clock signal CLK.

To perform A/D conversion once, sampling S for a period of one cycle and comparison C for a period of four cycles are performed, and comparison C includes S/H and comparator 2 performing comparison three times, i.e., comparisons CA1–CA3, and SAR and control circuit 21 performing latch LAA once, and S/H and comparator 3 performing comparison three times, i.e., comparisons CB1–CB3, and SAR and control circuit 21 performing latch LAB once. Comparisons CA1–CA3 and latch LAA, and comparisons CB1–CB3 and latch LAB are performed in parallel.

Initially in cycle 1 (time t0 to time t1) S/H and comparators 2 and 3 sample external analog input voltages VIA and VIB. The sampled external analog input voltages VIA and VIB are held by S/H and comparators 2 and 3, respectively, in response to clock signal CLK rising at time t1. The voltages held by S/H and comparators 2 and 3 will be referred to as VHA and VHB, respectively.

In cycle 2 (time t1 to time t2) reference voltage generator 23 sets reference voltages VCA and VCB both at voltage V4 and S/H and comparator 2 compares VHA with V4 (CA1) and S/H and comparator 3 compares VHB with V4 (CB1). Herein, V2<VHA<V3 and V5<VHB<V6 for the sake of illustration. VHA<V4 and VHB>V4, and signals φ2 and φ3 are set low (0) and high (1), respectively.

In cycle 3 (time t2 to time t3), in response to signals φ2 and φ3 reference voltage generator 23 sets reference voltages VCA and VCB at voltages V2 and V6, respectively, and S/H and comparator 2 compares VHA with V2 (CA2) and S/H and comparator 3 compares VHB with V6 (CB2). VHA>V2 and VHB<V6, and signals φ2 and φ3 are set high (1) and low (0), respectively.

In cycle 4 (time t3 to time t4), in response to signals φ2 and φ3 reference voltage generator 23 sets reference voltages VCA and VCB at voltages V3 and V5, respectively, and S/H and comparator 2 compares VHA with V3 (CA3) and S/H and comparator 3 compares VHB with V5 (CB3). VHA<V3 and VHB>V5, and signals φ2 and φ3 are set low (0) and high (1), respectively.

In cycle 5 (time t4 to time t5) signals φ2 and φ3 for four cycles 2–4 are latched by SAR and control circuit 4 (LAA and LAB) and output as data codes DA(0)=010 and DB(0)=101. Signals φ2 and φ3 for cycle 2 serve as data code DA's MSB and data code DB's MSB, respectively, and signals φ2 and φ3 for cycle 4 serve as data code DA's LSB and data code DB's LSB, respectively. Note that data codes DA(0) and DB(0) are preceded by data codes DA(−1) and DB(−1), which indicate a result of previous A/D conversion.

The third embodiment allows sampling, comparison and latching to be performed for two analog input voltages VIA and VIB in parallel. This can reduce the number of cycles required to perform A/D conversion once as compared with the first and second embodiments. Furthermore, two S/H and comparators 2 and 3 sharing resistor ladder 7 can contribute to a reduced chip area.

Figure 9:
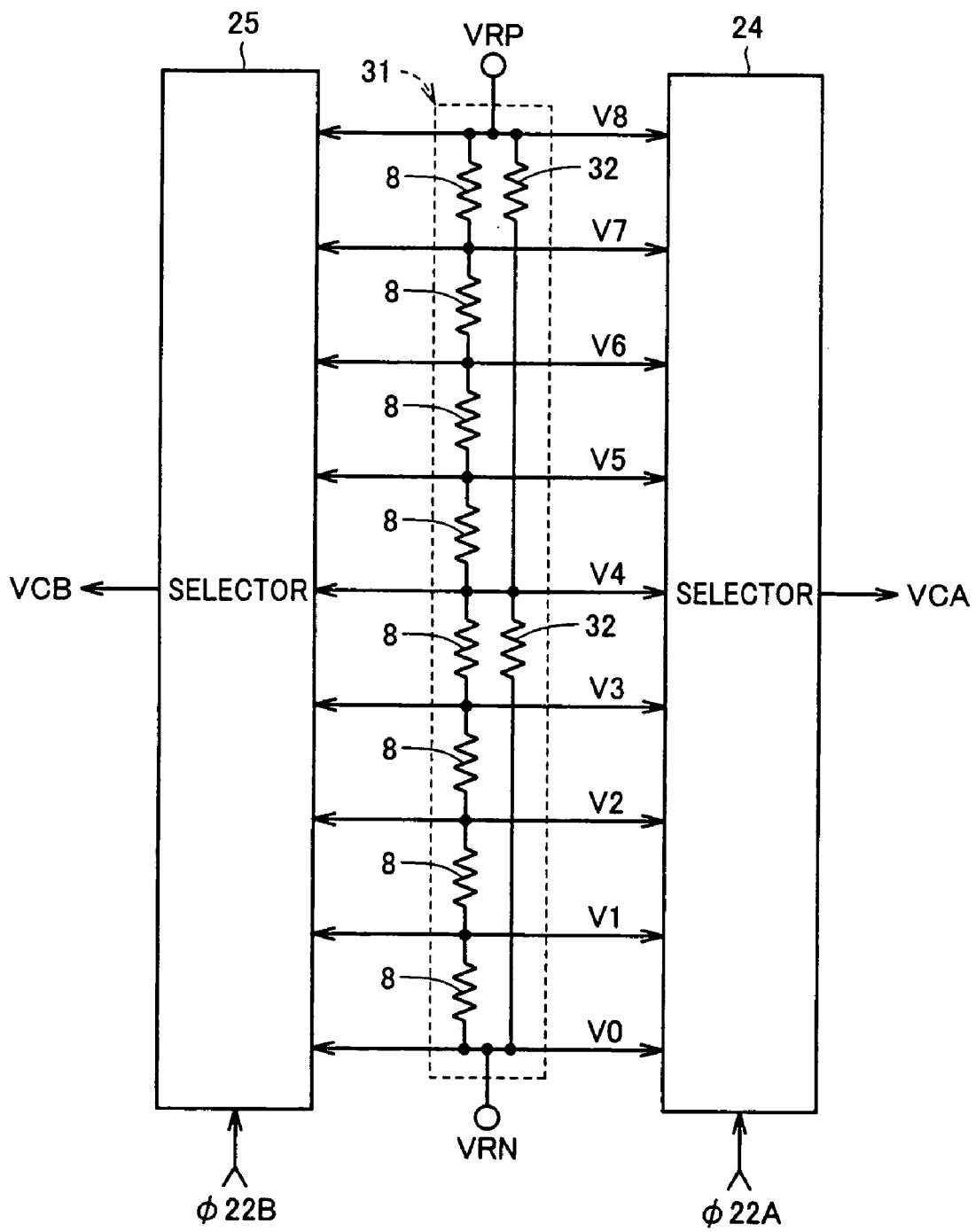
FIG. 9 is a circuit block diagram showing the third embodiment in an exemplary variation.

FIG. 9 is a circuit block diagram showing the third embodiment in an exemplary variation. With reference to the figure, this successive approximation A/D converter does not employ reference voltage generator 23 of FIG. 7 and instead employs a reference voltage generator 30. Reference voltage generator 30 corresponds to reference voltage generator 23 with resistor ladder 7 replaced with an intermesh resistor ladder 31 including eight resistor elements 8 connected in series between a node for a reference voltage for higher voltage VRP and a node for a reference voltage for lower voltage VRN, and two intermesh resistor elements 32, one connected between nodes for V8 and V4, and the other between those for V0 and V4. The exemplary variation introducing intermesh resistor elements 32 allows reference voltage generator 30 to have an increased capability to supply a current to allow reference voltages VCA and VCB to vary in level faster so that the successive approximation A/D converter can operate rapidly and be increased in precision. Note that while in this exemplary variation every four resistor elements are associated with a single intermesh resistor element 32 connected in parallel therewith, every two resistor elements 8 may be associated with a single intermesh resistor element 32 connected in parallel therewith.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A successive approximation A/D converter comprising:
   a first analog input terminal for receiving a first analog signal;
   a second analog input terminal for receiving a second analog signal;
   a first comparator coupled to said first analog input terminal;
   a second comparator coupled to said second analog input terminal; and
   a control circuit for selecting said first comparator to generate a first digital code and selecting said second comparator to generate a second digital code sequentially;
   wherein said first analog input signal is applied only to said first comparator and said second analog input signal is applied only to said second comparator for generation, respectively, of the first and second digital codes.

2. The successive approximation A/D converter of claim 1, wherein said control circuit is synchronized with a clock signal to operate to control said first and second comparators.

3. The successive approximation A/D converter of claim 1, wherein said control circuit latches said first digital code before selecting said second comparator.

4. The successive approximation A/D of claim 1, further comprising:
   a first sample and hold circuit coupled to said first comparator; and
   a second sample and hold circuit coupled to said second comparator.

* * * * *